(12) United States Patent
Imai

(10) Patent No.: US 6,864,035 B2
(45) Date of Patent: Mar. 8, 2005

(54) POSITIVE PHOTOSENSITIVE RESIN COMPOSITION, POSITIVE PHOTOSENSITIVE DRY FILM AND METHOD OF FORMING PATTERN

(75) Inventor: Genji Imai, Hiratsuka (JP)

(73) Assignee: Kansai Paint Co., Ltd., Amagasaki (JP)

( * ) Notice: Subject to any disclaimer, the term of this patent is extended or adjusted under 35 U.S.C. 154(b) by 98 days.

(21) Appl. No.: 09/976,278

(22) Filed: Oct. 15, 2001

(65) Prior Publication Data

US 2002/0068236 A1 Jun. 6, 2002

(30) Foreign Application Priority Data

Oct. 16, 2000 (JP) .......................... 2000-314987

(51) Int. Cl.[7] .................... G03F 7/038; G03F 7/38; G03F 7/42
(52) U.S. Cl. .................... 430/270.1; 430/258; 430/260; 430/326
(58) Field of Search ................ 430/258, 260, 430/270.1, 326

(56) References Cited

U.S. PATENT DOCUMENTS

| | | | | |
|---|---|---|---|---|
| 5,496,678 A | * | 3/1996 | Imai et al. | 430/176 |
| 5,801,212 A | * | 9/1998 | Okamoto et al. | 522/16 |
| 6,033,826 A | * | 3/2000 | Urano et al. | 430/270.1 |
| 6,072,006 A | * | 6/2000 | Bantu et al. | 525/262 |
| 6,140,025 A | * | 10/2000 | Imai et al. | 430/325 |
| 6,277,541 B1 | * | 8/2001 | Uno et al. | 430/278.1 |
| 6,555,286 B1 | * | 4/2003 | Imai et al. | 430/270.1 |

FOREIGN PATENT DOCUMENTS

| | | |
|---|---|---|
| JP | 09-138502 | 5/1997 |
| JP | 2000-035665 | 2/2000 |
| JP | 2000-056450 | 2/2000 |

OTHER PUBLICATIONS

JPO machine translation of Ichimura et al.( JP 2000–035665).*
JPO machine translation of Makoto et al.( JP 09–138502).*
International Search Report dated Dec. 25, 2001.

* cited by examiner

*Primary Examiner*—Yvette C. Thornton
(74) *Attorney, Agent, or Firm*—Armstrong, Kratz, Quintos, Hanson & Brooks, LLP

(57) ABSTRACT

The present invention provides a positive photosensitive resin composition comprising (A) a positive photosensitive resin, (B) a photoacid generator and (C) a photosensitizer which is a benzopyran condensed ring compound capable of increasing photosensitivity to visible light with a wavelength of 480 nm or more;
a positive photosensitive dry film prepared by applying the photosensitive resin composition to a surface of support film, followed by drying, to form a photosensitive resin layer; and
a method of forming a pattern using the resin composition or the dry film.

8 Claims, No Drawings

POSITIVE PHOTOSENSITIVE RESIN COMPOSITION, POSITIVE PHOTOSENSITIVE DRY FILM AND METHOD OF FORMING PATTERN

TECHNICAL FIELD

The present invention relates to novel positive photosensitive resin compositions, positive photosensitive dry films and methods of forming patterns.

BACKGROUND ART

Positive photosensitive resin compositions have been widely used in paints, inks, adhesives, resist materials, printing plate materials, information recording materials, materials for producing relief images, etc., because of their excellent characteristics such as non-polluting properties, resource- and energy-saving properties, high production efficiency and the like.

Positive photosensitive resin compositions are used in various applications, by utilizing the solubility difference occurring between exposed and unexposed parts. Conventionally, exposure of these compositions is carried out using visible light with an emission spectrum wavelength of, for example, 488 nm or 532 nm. However, conventional positive photosensitive resin compositions are not sufficiently sensitive to visible light, especially to visible light with a wavelength of 480 nm or more. Thus, conventional positive photosensitive resin compositions are incapable of forming a sharp resist pattern coating.

DISCLOSURE OF THE INVENTION

An object of the present invention is to provide a novel positive photosensitive resin composition and positive photosensitive dry film, both having high sensitivity to visible light with a wavelength of 480 nm or more.

Another object of the present invention is to provide a method of forming a pattern using the resin composition or dry film.

Other objects and features of the present invention will become apparent from the following description.

The present invention provides the following positive photosensitive resin compositions, positive photosensitive dry films and methods of forming patterns.

1. A positive photosensitive resin composition comprising:
(A) a positive photosensitive resin,
(B) a photoacid generator and
(C) a photosensitizer which is a benzopyran condensed ring compound capable of increasing photosensitivity to visible light with a wavelength of 480 nm or more.

2. A composition according to item 1, wherein the positive photosensitive resin (A) is a resin having a functional group or groups which are soluble in developers and are blocked with an acid-unstable group or groups.

3. A composition according to item 2, wherein the functional group or groups are a hydroxyl group or groups.

4. A composition according to item 1, wherein the positive photosensitive resin (A) is a carboxyl-and/or hydroxyphenyl-containing resin (a) in combination with an ether linkage-containing olefinic unsaturated compound (b).

5. A composition according to item 4, wherein the proportion of the unsaturated compound (b) is about 5 to 150 parts by weight per 100 parts by weight of the resin (a).

6. A composition according to item 1, wherein the proportion of the photoacid generator (B) is about 0.1 to 40 parts by weight per 100 parts by weight of the resin (A).

7. A composition according to item 1, wherein the photosensitizer (C) is a benzopyran condensed ring compound represented by Formula (1)

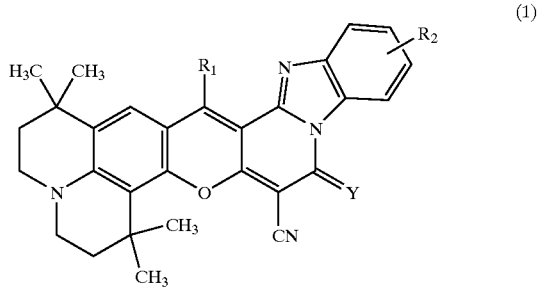

wherein $R_1$ is hydrogen, halogen, cyano, trifluoromethyl, carboxyl or carboxylic acid ester, $R_2$ is hydrogen, alkyl, alkoxy, cyano, trifluoromethyl, sulfoxy or halogen, and Y is NH or O.

8. A composition according to item 1, wherein the proportion of the photosensitizer (C) is about 0.1 to 10 parts by weight per 100 parts by weight of the total amount of the resin (A) and photoacid generator (B).

9. A composition according to item 1 which further comprises, as a photoacid proliferating agent (D), an organic acid ester (c) and/or a crosslinked carbocyclic compound (d) containing a crosslinked carbocyclic skeleton which has a hydroxyl group or groups bonded to any of the crosslinked carbocyclic rings and, at a carbon atom or atoms adjacent to the hydroxyl-bearing carbon atom or atoms, a sulfonate group represented by Formula (2)

wherein $R_5$ is acyl, aliphatic hydrocarbon, polycyclic aromatic hydrocarbon or a heterocyclic group.

10. A composition according to item 1, which is an organic solvent-based resin composition.

11. A composition according to item 1, which is an aqueous resin composition.

12. A positive photosensitive dry film prepared by applying a positive photosensitive resin composition according to item 1 to a surface of support film, followed by drying, to thereby form a positive photosensitive resin layer.

13. A method of forming a pattern comprising the steps of:
(1) applying a positive photosensitive resin composition according to item 1 to a substrate, followed by drying, to form a positive photosensitive resin coating,
(2) irradiating the resin coating with visible light directly or through a mask so as to obtain a desired pattern, and
(3) removing the irradiated part of the positive photosensitive resin coating by development to form a resist pattern coating.

14. A method of forming a pattern comprising the steps of:
(1') attaching a positive photosensitive dry film according to item 12 to a substrate so that the photosensitive resin layer of the dry film is in contact with the substrate to form a positive photosensitive resin coating, and optionally peeling off the support film of the dry film,
(2) irradiating the resin coating with visible light directly or through a mask so as to obtain a desired pattern, and
(3') peeling off the support film of the dry film when the support film has not been peeled off, and removing the irradiated part of the positive photosensitive resin coating by development to form a resist pattern coating.

The present inventors carried out intensive research to overcome the drawbacks of the prior art, and found that the drawbacks can be overcome by using, as a photosensitizer, a benzopyran condensed ring compound capable of increasing photosensitivity to visible light with a wavelength of 480 nm or more. The present invention has been accomplished based on this finding.

Positive Photosensitive Resin Composition

The positive photosensitive resin composition of the invention comprises (A) a positive photosensitive resin, (B) a photoacid generator and (C) a photosensitizer which is a benzopyran condensed ring compound capable of increasing sensitivity to visible light with a wavelength of 480 nm or more.

The positive photosensitive resin (A) for use in the invention is decomposable with an acid generated from the photoacid generator (B) by light irradiation. Specifically stated, by the action of an acid, the resin skeleton is cut into a low-molecular-weight form, or an acid group is added to the resin to change the polarity of the resin or convert the resin into a soluble substance. As a result, the resin shows dispersibility or solubility in an aqueous developer or an organic solvent developer. The soluble substance is, for example, (poly)p-hydroxystyrene or the like.

Any known positive photosensitive resin can be used as the positive photosensitive resin (A) without limitation. Typical examples include the following resins (i) and (ii).

(i) A chemical amplification photosensitive resin which undergoes a chain of elimination reactions in the presence of, as a catalyst, an acid generated from a photoacid generator by light irradiation, to produce a solubility difference between irradiated and unirradiated parts. Examples of such resins include those disclosed in Japanese Unexamined Patent Publication No. 1992-226461; U.S. Pat. No. 4,491,628; Japanese Unexamined Patent Publication No. 1984-45439; Japanese Unexamined Patent Publication No. 1988-250642; Davidson T., ed., *ACS Symposium Series* 242 *"Polymers in Electronics"*, American Chemical Society, Washington D.C. (1984), p.11; N. Hayashi, T. Ueno, M. Toriumi et al., *ACS Polym. Materials Sci. Eng.*, 61, 417 (1989).

(ii) A positive photosensitive resin which forms, when heated, a crosslinked coating which is insoluble in solvents and aqueous alkali solutions, and which is capable of becoming soluble in organic solvents or aqueous alkali solutions when irradiated with light, owing to severance of the crosslinked structure by an acid generated from an photoacid generator by light irradiation. Examples of such resins include those disclosed in Japanese Unexamined Patent Publications No. 1994-295064, No. 1994-308733, No. 1994-313134, No. 1994-313135, No. 1994-313136 and No. 1995-146552.

The resin (i) for use as the positive photosensitive resin (A) is preferably a resin having a functional group or groups which are soluble in developers and are blocked with an acid-unstable group or groups. Examples of functional groups soluble in developers include hydroxyl and carboxyl.

The resin (i) is a resin which has been rendered insoluble in developers by blocking its functional group or groups with an acid-unstable group or groups. The resin is capable of restoring solubility in developers when the acid-unstable group is dissociated by the action of an acid generated from a photoacid generator by light irradiation.

Examples of the acid-unstable group (R in —OR) capable of blocking an hydroxyl group (—OH) as a functional group include t-butoxycarbonyl (t-BOC), t-butoxy, t-butoxycarbonylmethyl, tetrahydropyranyl, trimethylsilyl and isopropoxycarbonyl. Examples of hydroxyl-containing resins are not limited as long the above effect can be achieved. Usually, a phenolic hydroxyl-containing resin is preferred.

Particularly preferred acid-unstable groups are t-BOC and t-butoxy. Examples of resins blocked with these groups include poly(t-butoxycarbonyloxystyrene); poly(t-butoxycarbonyloxy-αstyrene); poly(t-butoxystyrene); copolymers of t-butoxycarbonyloxystyrene, t-bitpxucarbonyloxy-α-styrene, t-butoxystyrene or like polymerizable monomer with other polymerizable monomers. Examples of other polymerizable monomers include $C_1$ to $C_{24}$ alkyl or cycloalkyl esters of (meth)acrylic acid, maleimides and sulfones.

For example, poly(t-butoxycarbonyloxystyrene) blocked with t-BOC is rendered soluble by the following mechanism: t-BOC is decomposed by an acid generated from a photoacid generator so that isobutene and carbonic acid gas are eliminated, thereby converting the poly(t-butoxycarbonyloxystyrene) into a hydroxyl-containing polystyrene. As a result, the resin is changed (increased) in polarity and is improved in solubility in developers (aqueous alkali solutions).

Further, t-butyl is preferred as an acid-unstable group (R' in —COOR') for blocking a carboxyl group (—COOH) as a functional group soluble in developers. Examples of resins blocked with this group include t-butyl-containing carboxylic acid ester derivatives.

The resin (ii) for use as the positive photosensitive resin (A) is preferably a carboxyl- or hydroxyphenyl-containing resin (a), which is more preferable when used in combination with an ether linkage-containing olefinic unsaturated compound (b).

The composition comprising the carboxyl- and/or hydroxyphenyl-containing resin (a), the ether linkage-containing olefinic unsaturated compound (b) and the photoacid generator (B) is liquid or solid.

When the resin (a) has both carboxyl and hydroxyphenyl groups, the resin may be a single resin having these groups in the molecule, or a mixture of a carboxyl-containing resin and a hydroxyphenyl-containing resin.

The carboxyl-containing resin (a-1) may be, for example, a carboxyl-containing acrylic resin, a carboxyl-containing polyester resin or the like.

It is generally preferable that the resin (a-1) have a number average molecular weight of about 500 to 100,000, especially about 1,500 to 30,000, and contain about 0.5 to 10 moles, especially about 0.7 to 5 moles, of carboxyl groups per 1 kg of the resin.

The hydroxyphenyl-containing resin (a-2) may be, for example, a mono- or multifunctional phenol compound, an alkylphenol compound, a condensate of a mixture of these compounds with a carbonyl compound such as formaldehyde or acetone; or a copolymer of p-hydroxystyrene or like hydroxyphenyl-containing unsaturated monomer and optionally other polymerizable unsaturated monomers. The other polymerizable monomers include, for example, $C_1$ to $C_{24}$ alkyl or cycloalkyl esters of (meth)acrylic acid, maleimides and sulfones.

It is generally preferable that the resin (a-2) have a number average molecular weight of about 500 to 100,000, especially about 1,500 to 30,000, and contain about 1.0 mole or more, especially about 2 to 8 moles of hydroxyphenyl groups per 1 kg of the resin.

When the resins (a-1) and (a-2) are used in combination, these resins are used in a weight ratio of 90/10 to 10/90.

The carboxyl- and hydroxyphenyl-containing resin (a-3) may be, for example, a copolymer of a carboxyl-containing polymerizable unsaturated monomer, a hydroxyphenyl-containing polymerizable unsaturated monomer and optionally other polymerizable unsaturated monomers; a phenol resin obtained by reaction of formaldehyde with hydroxybenzoic acid, gallic acid, resorcylic acid or the like; or a phenol resin obtained by reaction of formaldehyde with a mixture of hydroxybenzoic acid, gallic acid, resorcylic acid or the like with phenol, naphthol, resorcin, catechol or the like.

Examples of carboxyl-containing polymerizable unsaturated monomers include (meth)acrylic acid and maleic acid. Examples of hydroxyphenyl-containing polymerizable unsaturated monomers include hydroxystyrene. Examples of other polymerizable unsaturated monomers include methyl (meth)acrylate, ethyl (meth)acrylate, propyl (meth)acrylate, butyl (meth)acrylate, 2-ethylhexyl (meth)acrylate and like $C_1$ to $C_{12}$ alkyl esters of acrylic acids, styrene and like aromatic compounds, and (meth)acrylonitrile and like nitrogen-containing unsaturated monomers.

It is generally preferable that the resin (a-3) have a number average molecular weight of about 500 to 100,000, especially about 1,500 to 30,000, and contain about 0.5 to 10 moles, especially about 0.7 to 5 moles, of carboxyl groups per 1 kg of the resin, and about 1.0 mole or more, especially about 2 to 8 moles of hydroxyphenyl groups per 1 kg of the resin.

The ether linkage-containing olefinic unsaturated compound (b) is a low or high molecular weight compound having, per molecule, at least one, preferably 2 to 4, unsaturated ether group(s) represented by Formula (3)

wherein A is vinyl, 1-propenyl, 1-butenyl or like olefinic unsaturated group, R" is ethylene, propylene, butylene or like $C_1$ to $C_6$ linear or branched alkylene. Preferably, the compound (b) has the unsaturated ether group of Formula (3) at an end of the molecule.

Specific examples of the compound (b) include condensates of polyphenol compounds or polyols with halogenated alkyl unsaturated ethers; and reaction products of polyisocyanate compounds and hydroxyalkyl unsaturated ethers. Particularly preferred are condensates of polyphenol compounds and halogenated alkyl unsaturated ethers, and reaction products of aromatic ring-containing polyisocyanate compounds and hydroxyalkyl unsaturated ethers, from the viewpoints of etching resistance, precision of the pattern to be formed, etc.

Examples of polyphenol compounds include bisphenol A, bisphenol F, bisphenol S and phenol resins. Examples of polyols include ethylene glycol, propylene glycol, trimethylolpropane, trimethylolethane and pentaerythritol. Examples of halogenated alkyl unsaturated ethers include chloroethyl vinyl ether. Polyisocyanate compounds include, for example, tolylene diisocyanate, xylylene diisocyanate, hexamethylene diisocyanate and isophorone diisocyanate.

The compound (b) is usually used in a proportion of about 5 to 150 parts by weight, preferably about 10 to 100 parts by weight, per 100 parts by weight of the resin (a).

A coating formed from a composition comprising the carboxyl- and/or hydroxyphenyl-containing resin (a), the ether linkage-containing olefinic unsaturated compound (b) and the photoacid generator (B) is rendered insoluble in organic solvents and aqueous alkali solutions when heated, because the coating is crosslinked by addition reaction between carboxyl and/or hydroxyphenyl groups with unsaturated ether group(s). When the coating is then irradiated with light and further heated, the crosslinked structure is cut by hydrolysis reaction caused by catalytic action of an acid generated from the photoacid generator (B). As a result, the irradiated part becomes soluble again in organic solvents and aqueous alkali solutions. Thus, the composition is a positive photosensitive resin composition.

Water is preferably present to allow the acid hydrolysis reaction to proceed smoothly. Therefore, the composition may contain a hydrophilic high molecular weight compound such as polyethylene glycol, polypropylene glycol, methyl cellulose or ethyl cellulose, so that the resulting coating can easily incorporate water required for hydrolysis reaction. The amount of the hydrophilic high molecular weight compound to be added is usually not greater than 20 parts by weight, preferably 0.1 to 10 parts by weight, per 100 parts by weight of the resin (a).

The photoacid generator (B) in the positive photosensitive resin composition of the invention is a compound that produces an acid when exposed. The generated acid acts as a catalyst to decompose the resin. Known photoacid generators are usable, which include sulfonium salts, ammonium salts, phosphonium salts, iodonium salts, selenium salts and like onium salts; iron-allene complexes; silanol-metal chelate complexes; triazine compounds; diazide naphthoquinone compounds; sulfonic acid esters; sulfonic acid imide esters; and halogen compounds.

Among these compounds, preferred are onium salts, sulfonic acid imide esters and the like. Also usable are photoacid generators disclosed in Japanese Unexamined Patent Publication No. 1995-146552 and Japanese Patent Application No. 1997-289218.

Specific examples of iodonium salts include chlorides, bromides, borofluorides, hexafluorophosphate salts or hexafluoroarsenate salts of diphenyliodonium, ditolyliodonium, phenyl(p-anisyl)iodonium, bis(m-nitrophenyl) iodonium, bis(p-chlorophenyl)iodonium or like iodonium.

Specific examples of sulfonium salts include triarylsulfonium salts and dialkyl-4-hydroxysulfonium salts.

Specific examples of phosphonium salts include triarylphosphonium salts.

Specific examples of sulfonic acid esters include benzoin tosylate, pyrogallol trimesylate, o-nitrobenzyl tosylate, 2,5-dinitrobenzyl tosylate, N-tosyl phthalic acid imide, α-cyanobenzylidene tosyl amine and p-nitrobenzil-9,10-diethoxyanthracene-2-sulfonate.

Specific examples of sulfonic acid imide esters include imide sulfonate.

Specific examples of silanol-metal chelate complexes include silanol-aluminium complexes.

Commercial products of photoacid generators are, for example, Cyracure UVI-6970, Cyracure UVI-6974, Cyracure UVI-6990 and Cyracure UVI-6950 (tradenames of Union Carbide Corp. (U.S.)), Irgacure 261 (a tradename of Ciba Specialty Chemicals), SP-150 and SP-170 (tradenames of Asahi Denka Kogyo K.K.), CG-24-61 (a tradename of Ciba Specialty Chemicals), DAICAT-11 (a tradename of Daicel Chemical Industries, Ltd.), CI-2734, CI-2758 and CI-2855 (all tradenames of Nippon Soda Co., Ltd.), PI-2074 (a tradename of Rhone Poulenc SA, pentafluorophenylborate tolyl cumyl iodonium salt), FFC509 (a tradename of 3M), BBI102 and NAI-105 (tradenames of Midori Kagaku Co., Ltd.), etc.

The photoacid generator (B) can be used as mixed with the resin (A) or as bonded to the resin (A).

Resins containing the photoacid generator (B) incorporated into the skeleton of the resin (A) are, for example, resins which generate acid groups when exposed, to thereby enable alkali development. Examples of such resins include those in which a naphthoquinone diazide sulfonic acid is bonded to an acrylic resin or like resin containing ionforming groups via a sulfonic acid ester linkage (see Japanese Unexamined Patent Publications No. 1986-206293 and No. 1995-133449). When these resins are irradiated with light, quinone diazide groups contained therein are photolyzed to form indenecarbosylic acid via ketene.

The proportion of the photoacid generator (B) is usually about 0.1 to 40 parts by weight, in particular about 0.2 to 20 parts by weight, per 100 parts by weight of the positive photosensitive resin (A).

The photosensitizer (C) for use in the composition of the invention is a benzopyran condensed ring compound capable of increasing photosensitivity to visible light with a wavelength of 480 nm or more. The benzopyran condensed ring compound is preferably one represented by Formula (1).

In Formula (1), the halogen atoms represented by $R_1$ and $R_2$ each may be, for example, fluorine or chlorine. Examples of the carboxylic acid ester group represented by $R_1$ include ethyl carboxyl, butyl carboxyl, octyl carboxyl, 4-butylphenyl carboxyl and 4-hexylcyclohexyl carboxyl. The alkyl group represented by $R_2$ include methyl, ethyl, butyl, octyl, dodecyl and octadecyl. Examples of the alkoxy group represented by $R_2$ include methoxy and ethoxy.

As specific examples of the benzopyran condensed ring compound of Formula (1), the following compounds can be mentioned.

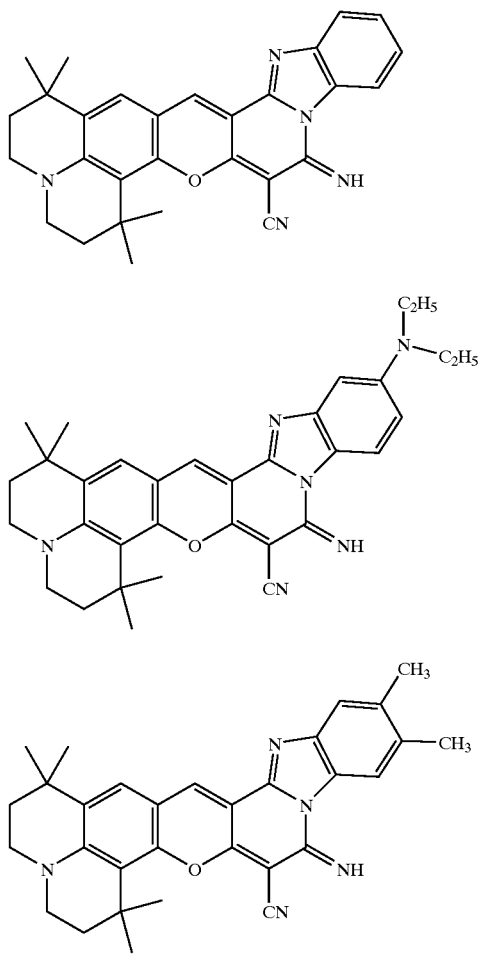

In the present invention, photosensitizing dyes can be used as required, in addition to the photosensitizer (C).

Examples of photosensitizing dyes include thioxanthene dyes, xanthene dyes, ketone dyes, thiopyrylium salt dyes, base styryl dyes, merocyanine dyes, 3-substituted coumarin dyes, 3,4-substituted coumarin dyes, cyanine dyes, acridine dyes, thiazine dyes, phenothiazine dyes, anthracene dyes, coronene dyes, benzanthracene dye, perylene dyes, merocyanine dyes, ketocoumarin dyes, fumarine dyes, borate dyes and other photosensitizing dyes. Usable borate photosensitizing dyes include, for example, those shown in Japanese Unexamined Patent Publications No. 1993-241338, No. 1995-5685 and No. 1995-225474.

The proportion of the photosensitizer (C) for use in the composition of the invention is preferably about 0.1 to 10 parts by weight, especially about 0.3 to 5 parts by weight, per 100 parts by weight of the total amount of the resin (A) and photoacid generator (B).

The composition of the invention may further comprise a photoacid proliferating agent (D), if necessary.

Preferred as the photoacid proliferating agent (D) are an organic acid ester (c) and a crosslinked carbocyclic compound (d) containing a crosslinked carbocyclic skeleton which has a hydroxyl group or groups bonded to any of the crosslinked carbocyclic rings and, on a carbon atom or atoms adjacent to the hydroxyl-bearing carbon atom or atoms, a sulfonate group represented by Formula (2)

$$-OSO_{d\,2}-R_5 \qquad (2)$$

wherein $R_5$ is acyl, aliphatic hydrocarbon, polycyclic aromatic hydrocarbon or a heterocyclic group. The aliphatic hydrocarbon group represented by $R_5$ in Formula (2) may be, for example, chain or cyclic (including crosslinked carbocyclic) alkyl or alkenyl. The aliphatic hydrocarbon group has usually 1 to 12, preferably 1 to 8, carbon atoms. The polycyclic aromatic hydrocarbon group may be, for example, naphthyl, biphenyl or naphthylmethyl. The heterocyclic group may have a monocyclic or polycyclic structure, and may be any hetetocyclic group derived from various known heterocyclic compounds. These aliphatic hydrocarbon group, polycyclic aromatic hydrocarbon group and heterocyclic group may be substituted by halogen, hydrocarbonoxy, amino, substituted amino or the like.

Examples of acyl groups include formyl, acetyl, benzoyl and cinnamoyl. Examples of aliphatic hydrocarbon groups and polycyclic aromatic hydrocarbon groups include methyl, ethyl, propyl, butyl, hexyl and like alkyl groups; vinyl, propenyl, allyl and like alkenyl groups; cyclohexyl, cyclooctyl, bicyclo hydrocarbon, tricyclo hydrocarbon and like cycloalkyl groups; naphthyl, naphthylmethyl, biphenyl and like aryl or arylalkyl groups; and these groups in a substituted form. Specific examples of heterocyclic groups include those derived from various heterocyclic compounds, such as furan, thiophene, pyrrole, benzofuran, thionaphthene, indole, carbazole and like five-membered ring compounds containing one hetero atom, and condensed ring compounds thereof; oxazole, thiazole, pyrazole and like five-membered compounds having two hetero atoms, and condensed ring compounds thereof; pyran, pyrone, coumarine, pyridine, quinoline, isoquinoline, acridine and like six-membered compound having one hetero atom, and condensed ring compounds thereof; and pyridazine, pyrimidine, pyrazine, phthalazine and like six-membered compounds containing two hetero atoms, and condensed ring compounds thereof.

The photoacid proliferating agent (D), when used in combination with the photoacid generator (C), is decomposed by an acid released from the photoacid generator (C) by light irradiation to thereby produce a free acid. The produced acid further decomposes the photoacid proliferating agent so that a free acid is further produced. Thus, the photoacid proliferating agent is decomposed in a chain-like manner by light irradiation, thereby forming numerous free acid molecules.

The organic acid ester (c) is a compound substituted by a residue of a relatively strong acid and capable of readily producing an acid by elimination in the presence of a photoacid generator. Specifically stated, the ester (c) is decomposed by an acid generated from a photoacid generator and produces an acid (hereinafter referred to as "ZOH"). Since at least one acid molecule is produced by one reaction, the acid concentration is acceleratedly increased as the reactions proceed, and thus the composition is highly improved in photosensitivity. Preferred acid strength of the generated acid (ZOH) is an acid dissociation constant (pKa) not greater than 3, especially not greater than 2. A weaker acid is incapable of causing elimination reaction by an acid catalyst. As examples of the acid (ZOH), there can be mentioned dichloroacetic acid, trichloroacetic acid, methanesulfonic acid, ethanesulfonic acid, benzenesulfonic acid, p-toluenesulfonic acid, naphthalenesulfonic acid, phenylphosphonic acid and the like.

The first example of the photoacid proliferating agent (D) is an organic acid ester compound represented by Formula (4):

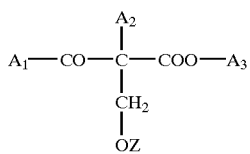

(4)

wherein $A_1$ is $C_1$ to $C_6$ alkyl or aryl, $A_2$ is $C_1$ to $C_6$ alkyl, $A_3$ is bis(p-alkoxyphenyl)methyl, 2-alkyl-2-propyl, 2-aryl-2-propyl, cyclohexyl or tetrahydropyranyl, Z is a residue of an acid represented by the formula ZOH and having a pKa not greater than 3.

In Formula (4), the $C_1$ to $C_6$ alkyl groups represented by $A_1$ and $A_2$ each may be, for example, methyl, ethyl, propyl or the like. The aryl group represented by $A_1$ may be, for example, phenyl or the like.

When an acid acts on the compound of Formula (4), the ester group decomposes into carboxylic acid. Further, decarboxylation is caused to eliminate the acid (ZOH). Specific examples of the compound of Formula (4) are as follows.

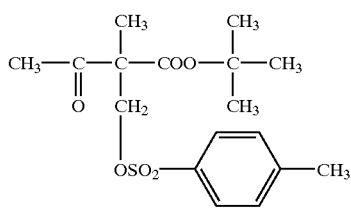

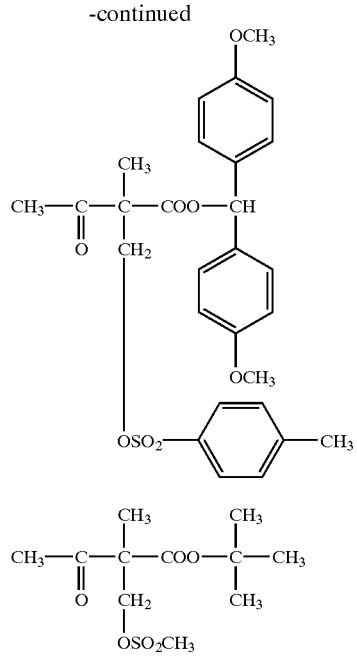

The second example of the photoacid proliferating agent (D) is an acetal- or ketal-containing organic acid ester represented by Formula (5):

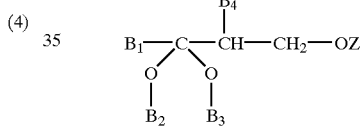

(5)

wherein Z is a residue of an acid represented by ZOH and having a pKa not greater than 3, $B_1$, is hydrogen, alkyl or aryl, $B_2$ and $B_3$ are each methyl or ethyl, or $B_2$ and $B_3$ are bonded together to form ethylene or propylene, and $B_4$ is hydrogen or methyl.

The alkyl group represented by $B_1$ in Formula (5) may be, for example, methyl, ethyl, propyl or the like. The aryl group represented by $B_1$ may be, for example, phenyl or the like.

In the compound of Formula (5), acetal or ketal is decomposed by an acid into β-aldehyde or ketone, from which ZOH is easily eliminated. Specific examples of the compound of Formula (5) are as follows:

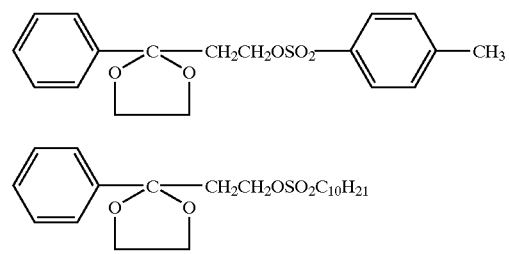

The third example of the photoacid proliferating agent (D) is an organic acid ester represented by Formula (6):

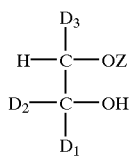
(6)

wherein Z is a residue of an acid represented by ZOH and having a pKa not greater than 3, $D_1$ and $D_3$ are each $C_1$ to $C_6$ alkyl, or $D_1$ and $D_3$ are bonded together to form alkylene or substituted alkylene constituting an alicyclic structure, and $D_2$ is hydrogen, $C_1$ to $C_6$ alkyl or aryl.

In Formula (6), the $C_1$ to $C_6$ alkyl groups represented by $D_1$, $D_2$ and $D_3$ each may be methyl, ethyl, propyl or the like. The alkylene or substituted alkylene group formed by $D_1$ and $D_3$ to constitute an alicyclic structure may be, for example, heptylene or the like. An example of the aryl group represented by $D_2$ is phenyl or the like.

It is presumed that, in the compound of Formula (6), the hydroxyl group is eliminated by an acid catalyst to form a carbocation, undergoes hydrogen transfer and then generates ZOH. Specific examples of the compound of Formula (6) are as follows.

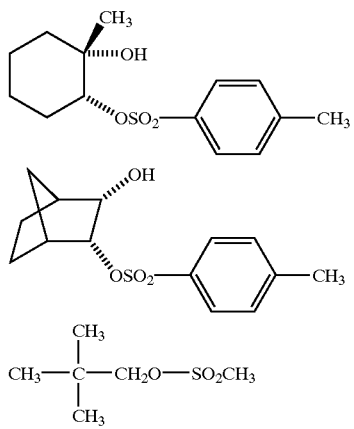

The fourth example of the photoacid proliferating agent (D) is an epoxy ring-containing organic acid ester represented by Formula (7).

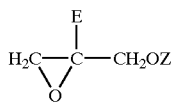
(7)

wherein Z is a residue of an acid represented by ZOH and having a pKa not greater than 3, and E is $C_1$ to $C_6$ alkyl or phenyl.

Examples of the $C_1$ to $C_6$ alkyl group represented by E in Formula (7) include methyl, ethyl and propyl.

When an acid acts on the compound of Formula (7), the epoxy ring opens to form a cation at the β-carbon, and an organic acid is generated as a result of hydrogen transfer. Specific examples of the compound of Formula (7) include the following:

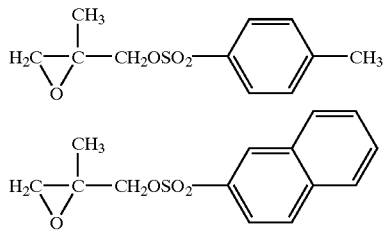

Also usable as the organic acid ester (c) are, for example, cis-3-(p-toluenesulfonyloxy)-2-pinanol as a monofunctional compound, and the following compounds as multifunctional compounds.

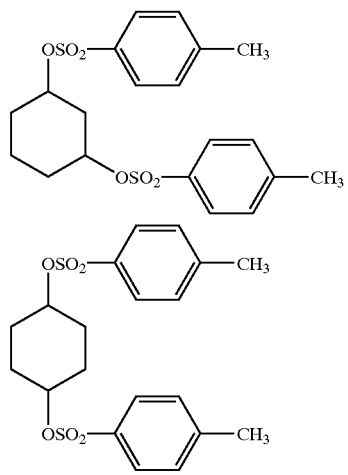

The organic acid ester (c) is stable at room temperature as long as no acid acts thereon. A specific acid strength is required for decomposition of the compound in the presence of an acid catalyst. A preferred acid strength is a pKa not greater than 3, especially not greater than 2. A weak acid having a pKa over 3 is incapable of causing reaction of the photoacid proliferating agent.

The crosslinked carbocyclic compound (d) for use as the photoacid proliferating agent (D) contains a crosslinked carbocyclic skeleton which has a hydroxyl group or groups bonded to any of the crosslinked carbon rings and, on a carbon atom or atoms adjacent to the hydroxyl-bearing carbon atom or atoms, a sulfonate group represented by Formula (2).

The compound (d) is decomposed by acid catalytic reaction and generates an acid ($R_5SO_3H$). One acid molecule is generated by one reaction, so that acid molecules are increased acceleratedly as the reactions proceed. For inducing self-decomposition of the generated acid, the acid strength of the generated acid is an acid dissociation constant (pKa) not greater than 3, especially not greater than 2. A weaker acid is not incapable of inducing self-decomposition. Examples of acids ($R_5SO_3H$) released by such reactions include methanesulfonic acid, ethanesulfonic acid, propanesulfonic acid, butanesulfonic acid, pentanesulfonic acid, hexanesulfonic acid, heptanesulfonic acid, octanesulfonic acid, cyclohexanesulfonic acid, camphorsulfonic acid, trifluoromethanesulfonic acid, 2,2,2-trifluoroethanesulfonic acid, benzenesulfonic acid, p-toluenesulfonic acid, p-bromobenzenesulfonic acid, p-nitrobenzenesulfonic acid, 2-thiophenesulfonic acid, 1-naphthalenesulfonic acid and 2-naphthalenesulfonic acid.

The compound (d) to be used as a photoacid proliferating agent can be decomposed in a chain-like manner by heating in the presence of an acid generated from a photoacid generator.

The compound (d) is characterized by having a crosslinked carbocyclic skeleton structure, such as a crosslinked structure comprising more than one, usually 2 to 6, preferably 2 to 3, carbocyclic rings. The crosslinked carbocyclic rings may have substituent(s) such as methyl, ethyl, propyl or like $C_1$ to $C_6$, preferably $C_1$ to $C_3$ lower alkyl, or unsaturated bond(s) such as double bond. The crosslinked carbocyclic rings have, within the molecule, crosslink(s) which rigidify the molecule, thus giving a photoacid proliferating agent with improved thermal stability.

As preferred examples of the compound (d), compounds represented by the following Formulas (8) to (11) can be mentioned.

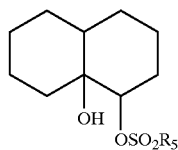
(8)

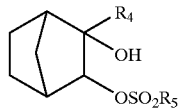
(9)

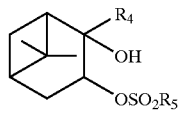
(10)

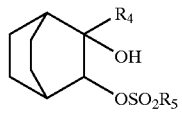
(11)

In the above Formulas, $R_5$ is as defined above, and $R_4$ is hydrogen, aliphatic hydrocarbon or aromatic hydrocarbon. Aliphatic hydrocarbon groups include chain or cyclic (including crosslinked cyclic) alkyl or alkenyl. Aromatic hydrocarbon groups include aryl, arylalkyl or the like. The aliphatic hydrocarbon and aromatic hydrocarbon groups may be substituted by halogen, alkoxy, amino, substituted amino or the like.

The aliphatic hydrocarbon group has 1 to 12, preferably 1 to 8, carbon atoms. The aromatic hydrocarbon group may have a monocyclic or polycyclic structure. $R_4$ is preferably aliphatic hydrocarbon or aromatic hydrocarbon.

Examples of alkyl groups include methyl, ethyl and propyl. Examples of alkenyl groups include propenyl. Examples of aryl groups include phenyl. The halogen atom may be, for example, fluorine or chlorine.

The bicyclo compound of Formula (8) (a decalin derivative) has crosslinks at the 1- and 6-positions. The bicyclo compounds of Formulas (9) and (11) have crosslinks at the 1- and 4-positions. The bicyclo compound of Formula (10) has crosslinks at the 1- and 3-positions. Therefore, in these bicyclo compounds, conformational change of the cyclohexane ring is highly suppressed and thus the ring structure shows rigidity.

Specific examples of the compound of Formula (10) are as follows.

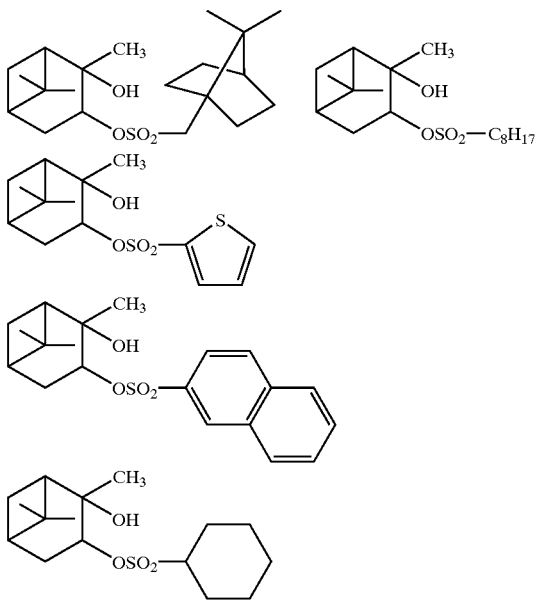

The composition of the invention may contain, if necessary, other resins capable of promoting or suppressing solubility in organic solvent-based or aqueous developers. Use of such a resin enables adjustment of the solubility of the composition. Usable resins include various resins which are insoluble, soluble or dispersible in water or organic solvents. Specific examples are phenol resins, polyester resins, acrylic resins, vinyl resins, vinyl acetate resins, epoxy resins, silicon resins, fluorine resins, mixtures or modified products of two or more of these resins, and the like.

Further, the composition of the invention may contain, if necessary, a plasticizer (e.g., phthalic acid ester), a polyester resin, an acrylic resin or the like to impart suitable flexibility, non-tackiness and other properties. Further, the composition of the invention may contain, as required, a fluidity modifier, a coloring agent such as dye or pigment, or the like.

The positive photosensitive resin composition of the invention can be prepared by mixing the ingredients in a routine manner. Use of a solvent is optional in the preparation of the composition.

The organic solvent-based positive photosensitive resin composition of the invention can be prepared by dissolving or dispersing the ingredients in an organic solvent such as a ketone, an ester, an ether, a cellosolve, an aromatic hydrocarbon, an alcohol or a halogenated hydrocarbon, in a routine manner. The organic solvent-based composition has a solid concentration of preferably about 1 to 50 wt.%.

The aqueous positive photosensitive resin composition of the invention can be prepared by dissolving or dispersing the ingredients in water in a routine manner. An aqueous organic solvent may be used in combination with water. The resin composition is rendered water-soluble or water-dispersible by neutralizing carboxyl groups or amino groups in the resin contained in the composition, with an alkali or an acid. The aqueous composition has a solid concentration of usually about 1 to 50 wt.%.

Positive Photosensitive Dry Film

The positive photosensitive resin composition of the invention is usable as a positive photosensitive dry film.

The positive photosensitive dry film of the invention is prepared by applying a positive photosensitive resin composition to a surface of support film, followed by drying, to form a positive photosensitive resin layer.

Usable as the support film are, for example, a film made of polyethylene terephthalate, low-density polyethylene or like material. These films are preferably transparent so that light irradiation can be performed through the films.

The positive photosensitive resin layer is formed on a surface of the support film usually by applying a positive photosensitive resin composition to the support film by roller coating, roll coater coating, gravure coating, spray coating or like coating process, and then drying the applied composition to volatilize water and organic solvent. During drying, the applied composition may be cured by heating, if necessary.

The support film is usually about 5 to 100 $\mu$m thick, and the positive photosensitive resin layer is usually about 2 to 100 $\mu$m thick.

Usually, the positive photosensitive dry film is attached to a surface of a substrate and irradiated with light before or after peeling off the support film.

Use of the Positive Photosensitive Resin Composition and Positive Photosensitive Dry Film The positive photosensitive resin composition and positive photosensitive dry film of the invention are excellent in photosensitivity to visible light, storage stability and other properties. Thus, the composition and dry film are widely useful in conventional applications of photosensitive materials, such as paints, inks, adhesives, resist materials, printing plate materials, information recording materials, materials for producing relief images, etc.

Resist materials include, for example, photoresists, solder resists and plating resists. Printing plate materials include, for example, materials for flat plates, relief plates, and PS plates for offset printing.

Method of Forming a Pattern

The positive photosensitive resin composition and positive photosensitive dry film of the invention are suitably usable as positive photoresists for forming a pattern coating on a printed board or like substrate.

The pattern forming method of the invention which employs a positive photosensitive resin composition comprises the steps of:

(1) applying the positive photosensitive resin composition of the invention to a substrate, followed by drying, to form a positive photosensitive resin coating,
(2) irradiating the resin coating with visible light directly or through a mask so as to obtain a desired pattern, and
(3) removing the irradiated part of the resin coating by development to form a resist pattern coating.

In Step (1), the positive photosensitive resin composition is applied to a substrate and dried to form a positive photosensitive coating.

Usable substrates include electrical insulation glass-epoxy plates, polyethylene terephthalate films, polyimide films and like plastic films and plastic plates; these plastic plates and plastic films having a conductive layer formed by attaching foil of copper, aluminium or like metal; substrates having a conductive layer formed by vacuum deposition, chemical vapor deposition, plating or like process using copper, nickel, silver or like metal or a compound of a conductive oxide (typically indium tin oxide (ITO)) or the like; plastic plates and plastic films provided with a through hole portion, whose surface and through hole portion are covered with a conductive layer; and metal plates such as copper plates.

The resin composition can be applied to a substrate by a process such as roller coating, roll coater coating, spin coater coating, curtain roll coater coating, spray coating, electrostatic coating, dip coating, silk printing or spin coating.

After applying the organic solvent-based or aqueous positive photosensitive resin composition to a substrate, the composition is optionally set and dried at about 50 to 130° C. to form a positive photosensitive resin coating.

The photosensitive resin coating thus formed preferably has a dry thickness of about 0.5 to 100 $\mu$m, especially about 1 to 50 $\mu$m.

In step (2), the resin coating formed in step (1) is irradiated with visible light either directly or through a mask to obtain a desired pattern. The irradiation decomposes the exposed part of the resin coating so that a desired resist pattern coating can be formed in the subsequent step (3).

Examples of lights usable for exposure include those in the visible region obtained by cutting, with a UV cutoff filter, lights from conventional light sources, such as extra-high-pressure, high-pressure, medium-pressure or low-pressure mercury lamps, chemical lamps, carbon arc lamps, xenon lamps, metal halide lamps, fluorescent lights, tungsten lamps and sunlight. Also usable are various lasers that produce an oscillating beam in the visible region. As laser sources, an argon laser (oscillating beam at 488 nm) or SHG-YAG laser (532 nm) are preferable since they have a stable high output.

In step (3), the part of the positive photosensitive resin coating irradiated in step (2) is removed by development to form a resist pattern coating.

The development can be preferably carried out by a liquid development process. In the liquid development process, the resin coating is, for example, sprayed with or dipped in a developer at about 10 to 80° C., preferably at about 15 to 50° C., for about 1 to 60 minutes, preferably about 2 to 30 minutes, so as to form a pattern from the resin coating.

The liquid development process can be carried out, for example, using an alkaline developer when the coating-forming resin contains acid group(s); or using an acid developer when the resin contains basic group(s); or using a water developer when the resin contains hydrophilic group(s); or using an organic solvent developer when the resin is soluble or dispersible in organic solvents.

Alkaline developers include, for example, aqueous solutions of monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, ammonia, caustic soda, caustic potash, sodium metasilicate, potassium metasilicate, sodium carbonate, tetraethylammonium hydroxide and the like.

Acid developers include, for example, aqueous solutions of formic acid, crotonic acid, acetic acid, propionic acid, lactic acid, hydrochloric acid, sulfuric acid, nitric acid, phosphoric acid and the like.

It is usually preferable that these developers have an acid or alkali concentration of about 0.05 to 10 wt. %.

Examples of organic solvents include hexane, heptane, octane, toluene, xylene, dichloromethane, chloroform, carbon tetrachloride, trichloroethylene and like hydrocarbon solvents; methanol, ethanol, propanol, butanol and like alcohol solvents; diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether and like ether solvents; acetone, methyl ethyl ketone, methyl isobutyl ketone, isophorone, cyclohexanone and like ketone solvents; methyl acetate, ethyl acetate, propyl acetate, butyl acetate and like ester solvents; pyridine, formamide, N,N-dimethyl formamide and like other solvents.

Thus, steps (1), (2) and (3) produce a desired resist pattern coating.

The pattern forming method of the invention which employs a positive photosensitive dry film comprises the steps of:

(1') attaching a positive photosensitive dry film of the invention to a substrate in such a manner that the photosensitive resin layer of the dry film is in contact with the substrate, to form a positive photosensitive resin coating, and optionally peeling off the support film of the dry film, (2) irradiating the resin coating with visible light directly or through a mask so as to obtain a desired pattern, and (3') peeling off the support film of the dry film when the support film has not been peeled off, and removing the irradiated part of the positive photosensitive resin coating by development to form a resist pattern coating.

In step (1'), a positive photosensitive dry film is attached to a substrate so that the photosensitive resin layer on the support film is in contact with the substrate, to form a positive photosensitive resin coating.

Useful substrates are as mentioned above. The support film may, but need not, be peeled off in this step. Drying is not necessary because a dry film is utilized.

Step (2) is as described above.

Step (3') is the same as step (3) except that the support film of the dry film is peeled off when the support film has not been peeled off in step (1').

Thus, steps (1'), (2) and (3') produce a desired resist pattern coating.

The method of the invention is capable of forming an extremely fine pattern with excellent contrast.

The method of the invention may be modified to be adapted to various applications, as long as it comprises the above steps.

The method finds applications in various industries including: electrical industries such as electrical components, lighting, electronic devices, semiconductors, printed circuits, electronic communication and electric power; physical industries such as measurement, optics, display, sound, control, automatic selling, signals and information recording; chemIcal metallurgical and fiber industries such as inorganic chemistry, organic chemistry, macromolecular chemistry, metallurgy and fibers; processing and transportation industries such as separation and mixing, metal working, plastic working, printing, containers and packaging; daily necessities industries such as agricultural and marine products, foods, fermentation, household goods, health and recreation; and applications in mechanical engineering industries.

Specific examples of applications in electrical industries include formation of black matrix insulating coatings, formation of insulating coatings by build-up process, formation of solder resist insulating coatings, formation of walls for display panels, formation of black belts for display panels, formation of colored insulating coatings for color filters, fluorescent materials for display panels, hologram patterns, CD mastering, coils, etc. Specific examples of applications in physical industries include optical fiber processing, floppy disks, magnetic tapes, magnetic cards, optical components, wave absorbers, etc. Specific examples of applications in chemical, metallurgical and fiber industries include glass, cement, ceramics and like inorganic insulating materials. Specific examples of applications in processing and transportation industries include printed matters, original printing plates, diffraction grating, marking, barcodes, masks, filters, etching, defrosters, cement processing, stone processing, fiber processing, plastic processing, labels, etc. Specific examples of applications in daily necessities industries include carriers, cosmetic products, fermentation industries, etc. Specific examples of applications in mechanical engineering industries include micromachine components, etc.

BEST MODE FOR CARRYING OUT THE INVENTION

The following Examples and Comparative Examples are provided to illustrate the present invention in further detail. In these examples, parts and percentages are all by weight.

EXAMPLE 1

Production of Aqueous Positive Photo-Sensitive Resin Composition I

A mixture of 200 parts of tetrahydrofuran, 65 parts of p-hydroxystyrene, 28 parts of n-butyl acrylate, 11 parts of acrylic acid and 3 parts of azobisisobutyronitrile was reacted at 100° C. for 2 hours. The reaction product was poured into 1,500 cc of toluene to precipitate and separate the reaction product. The precipitate was then dried at 60° C., giving an anionic photosensitive resin having a molecular weight of about 5,200 and containing 4.6 moles/kg of hydroxyphenyl groups. To 100 parts of the resin were subsequently added 60 parts of a divinyl ether compound (a condensate of 1 mole of bisphenol compound and 2 moles of 2-chloroethyl vinyl ether), 10 parts of NAI-105 (a tradename of Midori Kagaku Co., Ltd., a photoacid generator, sulfonic acid imide ester), 1.5 parts of NKX-1595 (a tradename of Nippon Kanko Shikiso, a coumarine photosensitizing dye) and 1 part of the following benzopyran condensed ring compound.

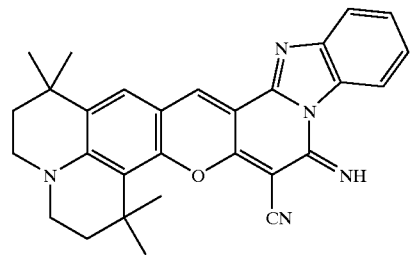

100 parts (as solids) of the thus obtained mixture was mixed with 7 parts of triethylamine with stirring and then dispersed in deionized water, giving an aqueous resin dispersion having a solid content of 15% (aqueous positive photosensitive resin composition I).

EXAMPLE 2

Production of Aqueous Positive Photo-Sensitive Resin Composition II

A mixture of 200 parts of tetrahydrofuran, 65 parts of p-hydroxystyrene, 18 parts of dimethylaminoethyl methacrylate, 17 parts of n-butyl acrylate and 3 parts of azobisisobutyronitrile was reacted at 100° C. for 2 hours. The reaction product was poured into 1,500 cc of toluene to precipitate and separate the reaction product. The precipitate was then dried at 60° C., thereby giving a cationic photosensitive resin having a molecular weight of about 5,000 and containing 4.6 moles/kg of hydroxyphenyl groups. To 100 parts of the resin were subsequently added 60 parts of a divinyl ether compound (a condensate of 1 mole of a bisphenol compound and 2 moles of 2-chloroethyl vinyl ether), 10 parts of NAI-105 (a tradename of Midori Kagaku Co., Ltd., a photoacid generator, sulfonic acid imide ester), 1.5 parts of NKX-1595 (a tradename of Nippon Kanko Shikiso, a coumarine photosensitizing dye), 1 part of the following benzopyran condensed ring compound and 1 part of cis-3-(p-toluenesulfonyloxy)-2-pinanol.

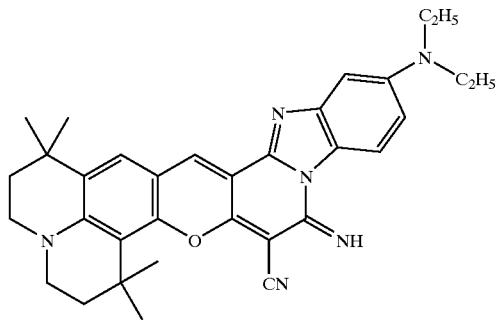

100 parts (as solids) of the thus obtained mixture was mixed with 7 parts of hydroxyacetic acid with stirring, and then dispersed in deionized water, giving an aqueous resin dispersion having a solid content of 15% (aqueous positive photosensitive resin composition II).

EXAMPLE 3

Production of Organic Solvent-Based Positive Photosensitive Resin Composition III A mixture prepared in the same manner as for the mixture in Example 1 (the mixture before mixing with triethylamine and water) was dissolved in diethylene glycol dimethyl ether to give a resin solution in an organic solvent having a solid content of 30% (an organic solvent-based positive photosensitive resin composition III).

EXAMPLE 4

Production of Organic Solvent-Based Positive Photosensitive Resin Composition IV A mixture prepared in the same manner as for the mixture in Example 2 (the mixture before mixing with hydroxyacetic acid and water) was dissolved in diethylene glycol dimethyl ether, giving a resin solution in an organic solvent having a solid content of 30% (organic solvent-based positive photosensitive resin composition IV).

COMPARATIVE EXAMPLE 5

Production of Aqueous Positive Photosensitive Resin Composition V

The procedure of producing aqueous positive photosensitive resin composition I in Example 1 was repeated except that the benzopyran condensed ring compound was not used, thereby giving comparative aqueous positive photosensitive resin compositions.

EXAMPLE 5

Production of Positive Photosensitive Dry Film I

Organic solvent-based positive photosensitive resin composition III was applied to a polyethylene terephthalate film to a dry thickness of 20 μm by roller coating, set and heated at 90° C. for 30 minutes to obtain dry film I.

EXAMPLE 6

Production of Positive Photosensitive Dry Film II

Organic solvent-based positive photosensitive resin composition IV was applied to a polyethylene terephthalate film to a dry thickness of 20 μm by roller coating, set and heated at 90° C. for 30 minutes to obtain dry film II.

EXAMPLE 7

Aqueous positive photosensitive resin composition I was applied to a surface of a copper-clad laminate to a dry thickness of 6 μm by roller coating, and heated at 80° C. for 20 minutes to form a positive photosensitive resin coating.

The surface of the positive photosensitive resin coating was exposed to direct irradiation with 5 mJ/cm$^2$ of argon laser (oscillating at 488 nm) in the shape of a pattern. Thereafter, the resin coating was heat-treated at 100° C. for 10 minutes.

Then, the resin coating was dipped in an alkaline developer (a 0.25% aqueous solution of sodium carbonate) at 25° C. for 60 seconds to develop the exposed part of the resin coating.

The obtained resist pattern coating was a well-formed, stripe-shaped pattern coating (line/space=100 μm/20 μm).

EXAMPLE 8

Aqueous positive photosensitive resin composition II was applied to a surface of a copper-clad laminate to a dry thickness of 6 μm by roller coating, dried at 80° C. for 20 minutes to obtain a positive photosensitive resin coating.

The surface of the positive photosensitive resin coating was exposed to direct irradiation with 5 mJ/cm$^2$ of argon laser (oscillating at 488 nm) in the shape of a pattern. Thereafter, the resin coating was heat-treated at 100° C. for 10 minutes.

Subsequently, the resin coating was dipped in an acid developer (a 1% aqueous solution of acetic acid) at 25° C. for 60 seconds to develop the exposed part of the resin coating.

The obtained resist pattern coating was a well-formed, stripe-shaped pattern coating (line/space=100 μm /20 μm).

EXAMPLE 9

Positive photosensitive dry film I was attached to a surface of a copper-clad laminate so that the resin layer of the dry film came into contact with the surface of the laminate. Then, the polyethylene terephthalate film was peeled off, giving a positive photosensitive resin coating.

The surface of the positive photosensitive resin coating was exposed to direct irradiation with 5 mJ/cm$^2$ of argon laser (oscillating at 488 nm) in the shape of a pattern. Thereafter, the resin coating was heat-treated at 100° C. for 10 minutes.

The resin coating was dipped in an alkaline developer (a 0.25% aqueous solution of sodium carbonate) at 25° C. for 60 seconds to develop the exposed part of the resin coating.

The obtained resist pattern coating was a well-formed, stripe-shaped pattern coating (line/space=100 μm /20 μm).

EXAMPLE 10

Positive photosensitive dry film II was attached to a surface of a copper-clad laminate so that the resin layer of the dry film care into contact with the surface of the laminate. Then, the polyethylene terephthalate film was peeled off, giving a positive photosensitive resin coating.

The surface of the positive photosensitive resin coating was exposed to direct irradiation with 5 mJ/cm$^2$ of argon laser (oscillating at 488 nm) in the form of a pattern. Thereafter, the resin coating was heat-treated at 100° C. for 10 minutes.

The resin coating was then dipped in an acid developer (a 1% aqueous solution of acetic acid) at 25° C. for 60 seconds to develop the exposed part of the resin coating.

The obtained resist pattern coating was a well-formed, stripe-shaped pattern coating (line/space 100 μm /20 μm).

COMPARATIVE EXAMPLE 1

A positive photosensitive resin coating was formed, exposed and developed in the same manner as in Example 1, except that aqueous positive photosensitive resin composition V was used in place of aqueous positive photosensitive resin composition I.

The obtained resist pattern coating was a poorly formed pattern coating which did not have a finely striped shape.

What is claimed is:

1. An aqueous positive photosensitive resin composition comprising:
   (A) a positive photosensitive resin component which is a carboxyl- and/or hydroxyphenyl-containing resin (a) in combination with an ether linkage-containing olefinic unsaturated compound (b),
   (B) a photoacid generator which is a sulfonic acid ester and/or a sulfonic acid imide ester,
   (C) a photo sensitizer which is a benzopyran condensed ring compound capable of increasing photosensitivity to visible light with a wavelength of 480 nm or more and is represented by Formula

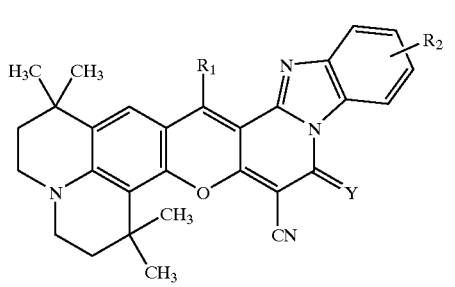

(1)

wherein $R_1$ is hydrogen, halogen, cyano, trifluoromethyl, carboxyl or carboxylic acid ester, $R_2$ is hydrogen, alkyl, alkoxy, cyano, trifluoromethyl, sulfoxy or halogen, and Y is NH or O, and (D) a photoacid proliferating agent which is an organic acid ester.

2. A composition according to claim 1, wherein the proportion of the unsaturated compound (b) is about 5 to 150 parts by weight per 100 parts by weight of the resin (a).

3. A composition according to claim 1, wherein the proportion of the photoacid generator (B) is about 0.1 to 40 parts by weight per 100 parts by weight of the resin (A).

4. A composition according to claim 1, wherein the proportion of the photosensitizer (C) is about 0.1 to 10 parts by weight per 100 parts by weight of the total amount of the resin (A) and photoacid generator (B).

5. A composition according to claim 1, which is an organic solvent-based resin composition.

6. A positive photosensitive dry film prepared by applying an aqueous positive photosensitive resin composition according to claim 1 to a surface of support film, followed by drying, to thereby form a positive photosensitive resin layer.

7. A method of forming a pattern comprising the steps of:
   (1') attaching a positive photosensitive dry film according to claim 6 to a substrate so that the photosensitive resin layer of the dry film is in contact with the substrate to form a positive photosensitive resin coating, and optionally peeling off the support film of the dry film,
   (2) irradiating the resin coating with visible light directly or through a mask so as to obtain a desired pattern, and
   (3') peeling off the support film of the dry film when the support film has not been peeled off, and removing the irradiated part of the positive photosensitive resin coating by development to form a resist pattern coating.

8. A method of forming a pattern comprising the steps of:
   (1) applying a positive photosensitive resin composition according to claim 1 to a substrate, followed by drying, to form a positive photosensitive resin coating,
   (2) irradiating the resin coating with visible light directly or through a mask so as to obtain a desired pattern, and
   (3) removing the irradiated part of the positive photosensitive resin coating by development to form a resist pattern coating.

* * * * *